United States Patent
Mulkens et al.

(10) Patent No.: US 7,224,431 B2
(45) Date of Patent: May 29, 2007

(54) LITHOGRAPHIC APPARATUS AND DEVICE MANUFACTURING METHOD

(75) Inventors: Johannes Catharinus Hubertus Mulkens, Waalre (NL); Johannes Christiaan Maria Jasper, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 238 days.

(21) Appl. No.: 11/062,765

(22) Filed: Feb. 22, 2005

(65) Prior Publication Data

US 2006/0187429 A1    Aug. 24, 2006

(51) Int. Cl.
G03B 27/42 (2006.01)
G03B 27/52 (2006.01)
G03B 27/58 (2006.01)

(52) U.S. Cl. .............................. 355/53; 355/30; 355/72

(58) Field of Classification Search ................ 355/30, 355/53, 68, 72, 77
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ........................ 95/44 |
| 4,346,164 A | 8/1982 | Tabarelli et al. ............ 430/311 |
| 4,390,273 A | 6/1983 | Loebach et al. ............. 355/125 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. .............. 355/30 |
| 5,040,020 A | 8/1991 | Rauschenbach et al. ...... 355/53 |
| 5,121,256 A | 6/1992 | Corle et al. .................. 359/664 |
| 5,311,288 A * | 5/1994 | Shahar ........................ 356/623 |
| 5,610,683 A | 3/1997 | Takahashi .................... 355/53 |
| 5,825,043 A | 10/1998 | Suwa .......................... 250/548 |
| 5,900,354 A | 5/1999 | Batchelder ................... 430/395 |
| 6,020,964 A * | 2/2000 | Loopstra et al. ............. 356/500 |
| 6,191,429 B1 | 2/2001 | Suwa .......................... 250/548 |
| 6,236,634 B1 | 5/2001 | Lee et al. .................... 369/112 |
| 6,600,547 B2 | 7/2003 | Watson et al. ................ 355/30 |
| 6,603,130 B1 | 8/2003 | Bisschops et al. ......... 250/492.1 |
| 6,730,920 B2 * | 5/2004 | Groeneveld et al. ...... 250/491.1 |
| 6,875,992 B2 * | 4/2005 | Castenmiller et al. ....... 250/548 |
| 2002/0020821 A1 | 2/2002 | Van Santen et al. ......... 250/492 |
| 2002/0163629 A1 | 11/2002 | Switkes et al. ................ 355/53 |
| 2003/0123040 A1 | 7/2003 | Almogy ....................... 355/69 |
| 2004/0000627 A1 | 1/2004 | Schuster ................... 250/201.2 |
| 2004/0075895 A1 | 4/2004 | Lin .............................. 359/380 |
| 2004/0114117 A1 | 6/2004 | Bleeker ....................... 355/53 |

(Continued)

FOREIGN PATENT DOCUMENTS

DE          206 607         2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Alan Mathews
(74) *Attorney, Agent, or Firm*—Pillsbury Winthrop Shaw Pittman LLP

(57) ABSTRACT

In, for example, an immersion lithography apparatus, a sensor that would normally be provided on the substrate table is replaced by a retro-reflector on the substrate table and a sensor at, for example, patterning device level. This may avoid the need to make the sensor compatible with the immersion liquid and also make incoupling of radiation easier since the numerical aperture may be less at, for example, patterning device level.

21 Claims, 4 Drawing Sheets

U.S. PATENT DOCUMENTS

| | | | |
|---|---|---|---|
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |
| WO | WO 2005/036624 | 4/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography: its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Later", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, J. Microlith., Microfab., Microsyst. 1(1):7-12 (2002).

Suwa et al. (Reissue Application of U.S. Patent No. 6,191,429 B1) U.S. Appl. No. 10/367,910, filed Feb. 19, 2003.

\* cited by examiner

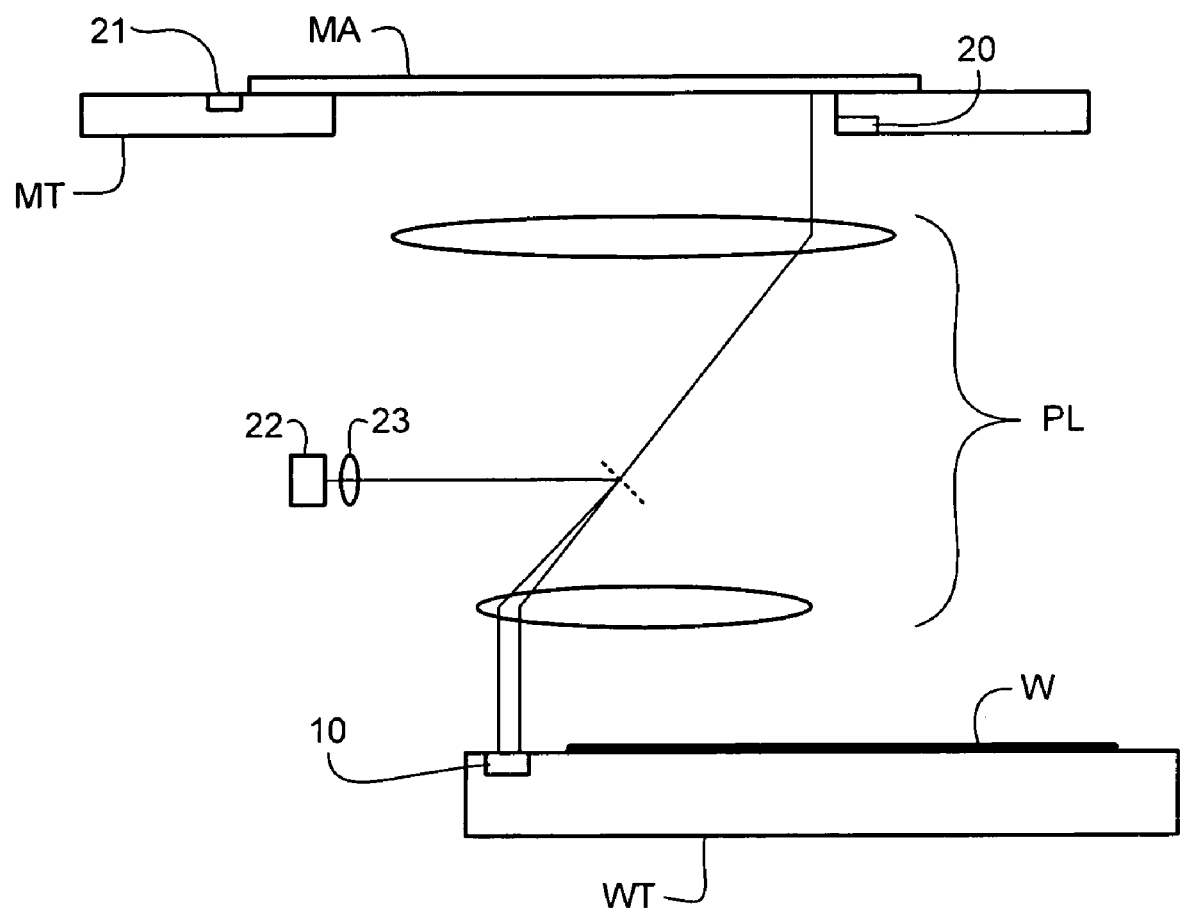

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling an increase in the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

It can be difficult to design a sensor for use with radiation having a high numerical aperture (NA) because it can be difficult to ensure that radiation arriving at the sensor at large angles to the normal is captured and has the same effect on the detecting element on the sensor as radiation arriving from directions nearer the normal. This may be a particular problem in immersion lithography apparatus, which aim to have a high NA at the substrate level, because of additional constraints on sensor design imposed by the need to be compatible with the immersion fluid, e.g. ultra pure water, an organic compound, a suspension or a solution. Many measurements that are desirable in a lithography apparatus can only or more accurately be made at the substrate level. For example, an energy sensor measuring the intensity of the projection beam placed somewhere upstream of the substrate table, e.g. on the mask table, cannot measure the effect of any parts of the apparatus, e.g. the projection system, that are downstream of it.

Accordingly, it would be advantageous, for example, to provide a sensor capable of measuring effects at substrate level using radiation having a high numerical aperture.

According to an aspect of the invention, there is provided a lithographic apparatus, comprising:

a support structure configured to hold a patterning device, the patterning device configured to impart a beam of radiation with a pattern;

a substrate table configured to hold a substrate;

a projection system configured to project the patterned beam onto a target portion of the substrate;

a retro-reflector located on the substrate table and arranged to direct radiation projected onto it by the projection system back into the projection system; and a sensor mounted other than on the substrate table and adapted to sense a property of radiation and arranged to receive radiation reflected back into the projection system by the retro-reflector.

According to a further aspect of the invention, there is provided a device manufacturing method, comprising:

projecting a patterned beam of radiation using a projection system onto a target portion of a substrate;

reflecting radiation back into the projection system using a retro-reflector mounted on a substrate table holding the substrate; and sensing a property of the radiation reflected back into the projection system using a sensor provided other than on the substrate table.

According to a further aspect of the invention, there is provided an immersion lithographic apparatus, comprising:

a substrate table configured to hold a substrate;

a projection system configured to project a patterned beam of radiation onto a target portion of the substrate;

a liquid supply system configured to supply a liquid to a space between the projection system and the substrate;

a retro-reflector located at or near the level of the substrate and arranged to direct radiation projected onto it by the projection system back into the projection system; and a sensor configured to sense a property of the radiation reflected back into the projection system by the retro-reflector.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9 depicts a sensor arrangement according to another embodiment of the invention.

DETAILED DESCRIPTION

Figure 1:
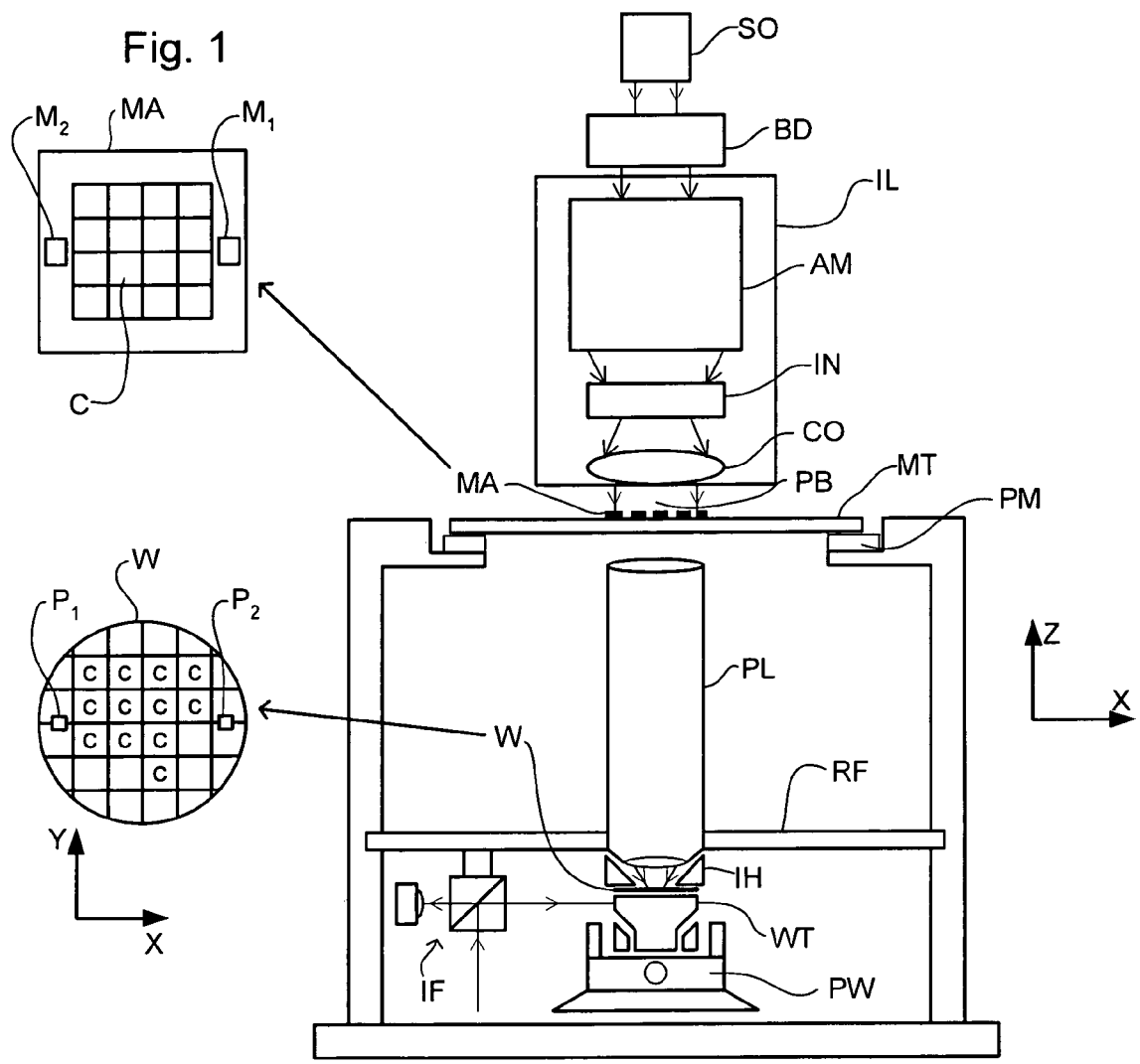
FIG. 1 depicts a lithographic apparatus according to an embodiment of the invention.
Figure 2:
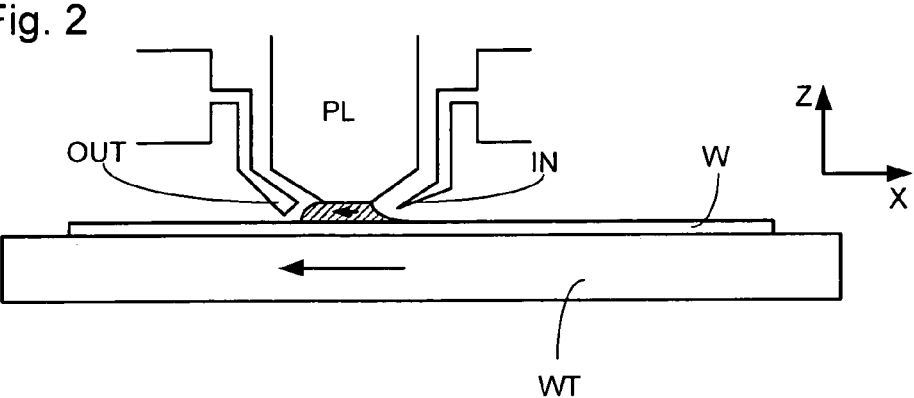
FIGS. 2 and 3 depict a liquid supply system for use in a lithographic projection apparatus.
Figure 3:
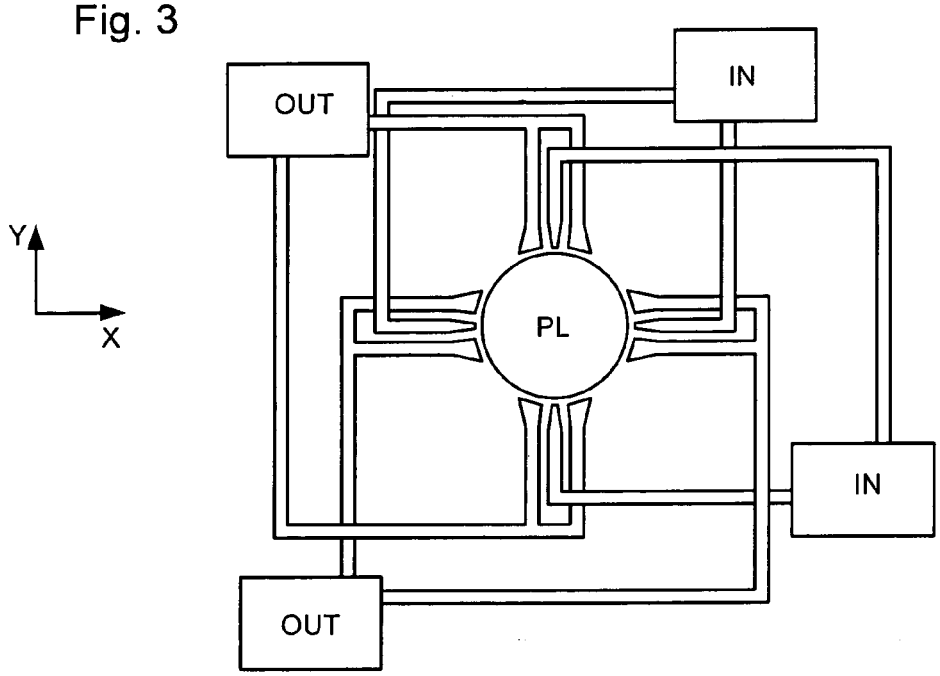

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which maybe fixed or movable as required. The support structure may ensure that the patterning device is at a desired position, for example with respect to the projection system.

Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT maybe connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
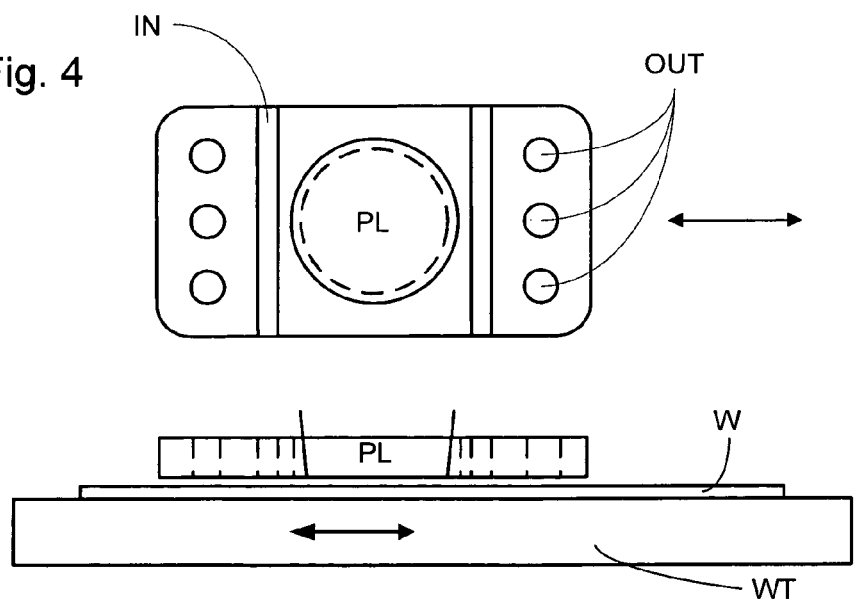
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
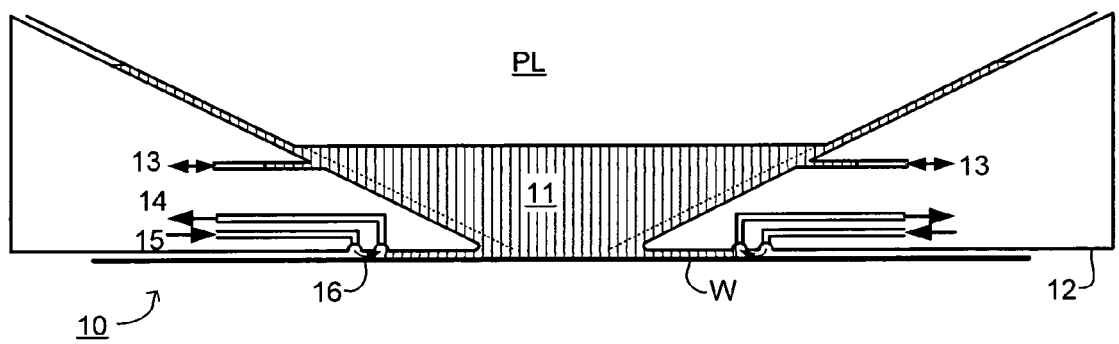
FIG. 5 depicts a liquid supply system for use in a lithographic apparatus according to an embodiment of the invention.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, United States patent application no. U.S. Pat. Ser. No. 10/844,575, hereby incorporated in its entirety by reference. A seal is typically formed between the liquid confinement structure and the surface of the substrate. In an embodiment, the seal is a contactless seal such as a gas seal.

FIG. 5 shows the liquid supply system (sometimes referred to as the immersion hood or showerhead) in an embodiment of the invention. Reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

Figure 6:
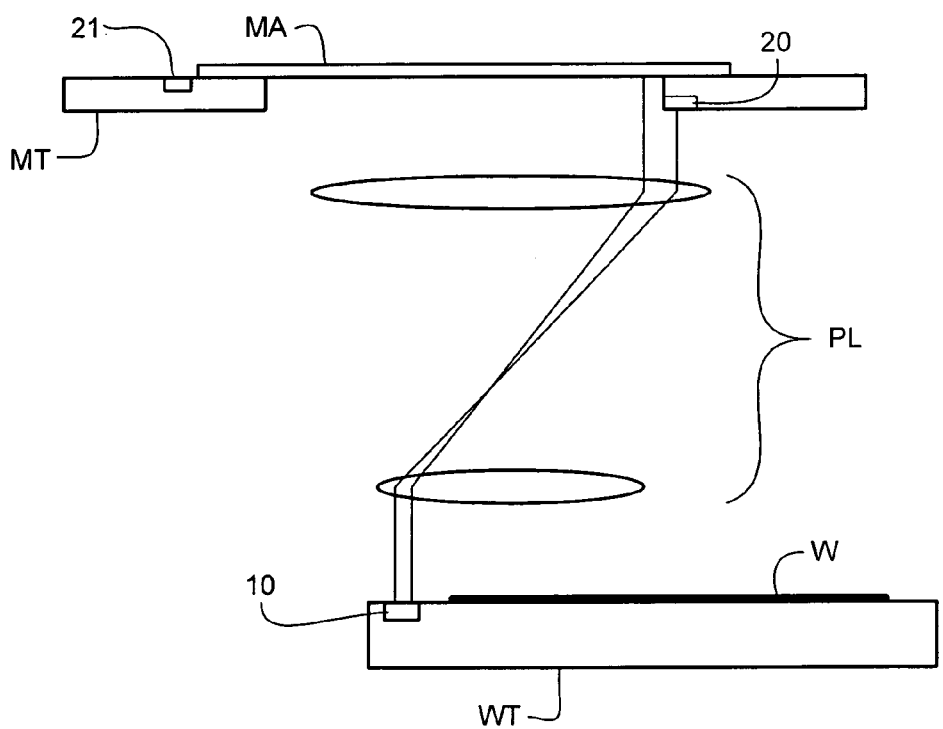
FIG. 6 depicts a sensor arrangement according to an embodiment of the invention.

FIG. 6 shows a sensor arrangement according to an embodiment of the invention. In place of a sensor—such as a transmission image sensor (TIS), energy sensor, aberration sensor, shearing interferometer sensor, alignment sensor, level sensor or polarization sensor—that would typically have been placed at substrate level, e.g. on the substrate table WT, a retro-reflector 10 is provided. The retro-reflector returns radiation that impinges upon it, e.g. radiation of the projection beam PB, back through the projection system PL to a sensor 20 provided at patterning device level, e.g. on the mask table. The sensor 20 measures the property of interest, e.g. intensity or polarization, in the radiation returned by the retro-reflector. An embodiment of the invention may of course also be used where a measurement beam, e.g. of different wavelength than the projection beam, is used.

The retro-reflector may be provided with appropriate coatings to facilitate an even reflectivity for all incident angles or may be provided with an optical element or system, e.g. a diverging lens, that reduces the numerical aperture of the incident radiation. Coatings may also be applied to facilitate that the reflection is not polarization sensitive, if required. If the sensor 20 is an alignment sensor, it may be desirable to provide the retro-reflector with an alignment mark.

The retro-reflector is advantageous where the high NA at substrate level makes coupling of the radiation into the sensor difficult, e.g. because of reflections at interfaces in the sensor. The NA at patterning device level is smaller than that at substrate level by a factor equal to the magnification of the projection system PL, typically ¼ or ⅕. Thus, incoupling of radiation to the sensor is correspondingly easier. In an embodiment, the NA at the sensor is less than 1. Also, the sensor at the patterning device level will likely not interact with the immersion liquid so there is little to no possibility of damage caused by the liquid.

In some cases the effect of the projection system PL on the property measured can be determined by the provision of a corresponding sensor 21 to measure that same property in the radiation prior to traversal of the projection system PL. The difference in measurements of the sensors 20 and 21 represents the effect of two passages through the projection system PL, from which the effect of one passage, and therefore the value at substrate level can be determined. It may also be necessary to take into account the effect of the retro-reflector, which can be established by calibration, and the patterning device in some cases.

The determined value of the property being measured, with or without compensation for the effect of two passages through the projection system, may be used in control or calibration of the apparatus. For example, a beam intensity measurement may be used to control the radiation source, scanning speed or a variable attenuator in the illumination system. A polarization measurement may be used to adjust a polarizer or retarder plate in the illumination system.

Figure 7:
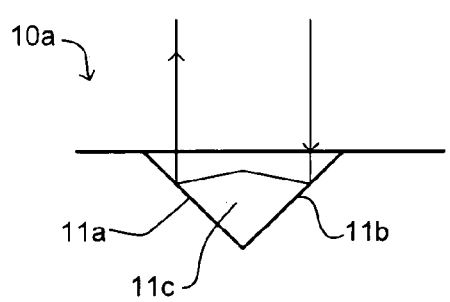
FIGS. 7 and 8 depict retro-reflectors useable in one or more embodiments of the invention.

FIG. 7 depicts a first retro-reflector 10a that maybe used in an embodiment of the invention. This is a so-called corner cube reflector and comprises three mirrors 11a–c that are mutually perpendicular. Within a fairly wide range of angles, an incoming ray is reflected by one, two or three of the mirrors so as to return on a path that is parallel to its incoming path. The amount of displacement between incoming and outgoing paths depends on the angle of incidence and the distance of the incoming ray from the center of the corner cube. If necessary, coatings may be applied to each of the mirrors to ensure the reflectivity of the corner cube is uniform with angle of incidence.

Figure 8:
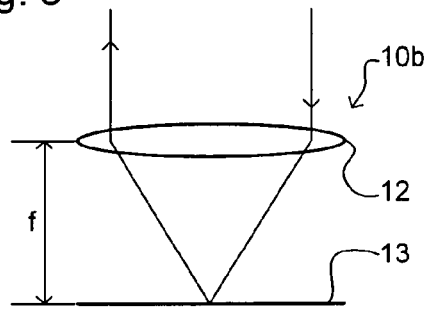

A second retro-reflector that may be used in an embodiment of the invention is a so-called cat's eye 10b, shown in FIG. 8. The cat's eye 10b comprises a converging lens 12 and a plane mirror 13 placed perpendicular to the optical axis of the lens 12 at a distance equal to the focal length of the lens. As shown, an incoming ray parallel to the optical axis is returned. An additional divergent lens may be provided to collimate the incoming converging radiation, to ensure complete reflection of the incident radiation.

FIG. 9 shows another embodiment of the invention, which is essentially the same as the embodiment described with respect to FIG. 6, save as described below.

In this embodiment, the sensor 22 is not provided on the support structure for the patterning device, but rather at a convenient location adjacent or in the projection system. Radiation returned by the retro-reflector 10, e.g. a corner cube reflector or a cat's eye, is directed to the sensor 20 by a partially-reflective folding mirror provided in a pupil plane of the projection system. Since the returned radiation has not passed back through the entire projection system, its NA may not be as reduced as it would have been at the patterning device support structure. Therefore, an additional lens or lens system 23 may be provided to reduce the NA of the radiation incident on the sensor 22, in an embodiment to less than 1.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. In a preferred embodiment, the apparatus, method and/or computer program product as described herein is applied to a single stage/table lithography apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it maybe a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a support structure configured to hold a patterning device, the patterning device configured to impart a beam of radiation with a pattern;
a substrate table configured to hold a substrate;
a projection system configured to project the patterned beam onto a target portion of the substrate;
a retro-reflector located on the substrate table and arranged to direct radiation projected onto it by the projection system back into the projection system; and
a sensor mounted other than on the substrate table and adapted to sense a property of radiation and arranged to receive radiation reflected back into the projection system by the retro-reflector.

2. The apparatus according to claim 1, wherein the retro-reflector is a corner cube.

3. The apparatus according to claim 1, wherein the retro-reflector is a cat's eye.

4. The apparatus according to claim 1, wherein the sensor is selected from the group comprising: an energy sensor, a transmission image sensor, a polarization sensor, an aberration sensor, a level sensor, a shearing interferometer sensor, and an alignment sensor.

5. The apparatus according to claim 1, further comprising a second sensor adapted to sense the same property as the sensor and arranged to receive radiation not having passed through the projection system.

6. The apparatus according to claim 1, further comprising an optical element or optical system adapted to reduce the numerical aperture of radiation incident on the retro-reflector.

7. The apparatus according to claim 1, further comprising an optical element or optical system adapted to reduce the numerical aperture of radiation incident on the sensor.

8. The apparatus according to claim 1, wherein the sensor is located on the support structure.

9. The apparatus according to claim 1, further comprising a partially reflective folding mirror located in a pupil plane of the projection system and oriented to direct radiation returned by the retro-reflector to the sensor.

10. The apparatus according to claim 1, further comprising a liquid supply system configured to supply a liquid to a space between the projection system and the substrate.

11. A device manufacturing method, comprising:
projecting a patterned beam of radiation using a projection system onto a target portion of a substrate;
reflecting radiation back into the projection system using a retro-reflector mounted on a substrate table holding the substrate; and
sensing a property of the radiation reflected back into the projection system using a sensor provided other than on the substrate table.

12. The method according to claim 11, wherein the retro-reflector is a corner cube.

13. The method according to claim 11, wherein the retro-reflector is a cat's eye.

14. The method according to claim 11, wherein the sensor is selected from the group comprising: an energy sensor, a transmission image sensor, a polarization sensor, an aberration sensor, a level sensor, a shearing interferometer sensor, and an alignment sensor.

15. The method according to claim 11, further comprising sensing the same property as the sensor using a second sensor arranged to receive radiation not having passed through the projection system.

16. The method according to claim 11, further comprising reducing the numerical aperture of radiation incident on the retro-reflector.

17. The method according to claim 11, further comprising reducing the numerical aperture of radiation incident on the sensor.

18. The method according to claim 11, wherein the sensor is located on a support structure holding a patterning device used to pattern the radiation beam.

19. The method according to claim 1, comprising directing radiation returned by the retro-reflector to the sensor using a partially reflective folding mirror located in a pupil plane of the projection system.

20. The method according to claim 11, further comprising supplying a liquid to a space between the projection system and the substrate.

21. A immersion lithographic apparatus, comprising:
a substrate table configured to hold a substrate;
a projection system configured to project a patterned beam of radiation onto a target portion of the substrate;
a liquid supply system configured to supply a liquid to a space between the projection system and the substrate;
a retro-reflector located at or near the level of the substrate and arranged to direct radiation projected onto it by the projection system back into the projection system; and
a sensor configured to sense a property of the radiation reflected back into the projection system by the retro-reflector.

* * * * *